(12) United States Patent
Ohashi et al.

(10) Patent No.: US 7,537,359 B2
(45) Date of Patent: May 26, 2009

(54) SUBSTRATE FOR MOUNTING LIGHT-EMITTING ELEMENT AND LIGHT-EMITTING ELEMENT MODULE

(75) Inventors: Masakazu Ohashi, Sakura (JP); Masanori Ito, Kohtoh-ku (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 11/951,706

(22) Filed: Dec. 6, 2007

(65) Prior Publication Data

US 2008/0130290 A1  Jun. 5, 2008

Related U.S. Application Data

(63) Continuation of application No. PCT/JP2006/311098, filed on Jun. 2, 2006.

(30) Foreign Application Priority Data

Jun. 7, 2005  (JP) ............... 2005-167493

(51) Int. Cl.
*F21V 29/00* (2006.01)
(52) U.S. Cl. .................. 362/294; 362/345; 362/800
(58) Field of Classification Search ............... 362/294, 362/345, 800
See application file for complete search history.

(56) References Cited

U.S. PATENT DOCUMENTS

| 5,857,767 A * | 1/1999 | Hochstein .............. 362/294 |
| 6,480,389 B1 * | 11/2002 | Shie et al. ............... 361/707 |
| 2005/0122018 A1 | 6/2005 | Morris |

FOREIGN PATENT DOCUMENTS

| JP | 58-500880 A | 5/1983 |
| JP | 59-9982 A | 1/1984 |
| JP | 62-84942 U | 5/1987 |
| JP | 62-99166 A | 5/1987 |
| JP | 62-261192 A | 11/1987 |
| JP | 64-27291 A | 1/1989 |
| JP | 3-36049 A | 2/1991 |
| JP | 7-85721 A | 3/1995 |
| JP | 2001-332768 A | 11/2001 |
| JP | 2001-332769 A | 11/2001 |
| JP | 2005-175427 A | 6/2005 |
| JP | 2006-147865 A | 6/2006 |
| WO | WO 83/00408 A1 | 2/1983 |

* cited by examiner

*Primary Examiner*—Thomas M Sember
(74) *Attorney, Agent, or Firm*—Sughrue Mion, PLLC

(57) ABSTRACT

A substrate for mounting a light-emitting element that has excellent efficiency in extracting light from a light-emitting element and can be manufactured at a low cost. The substrate for mounting a light-emitting element 11 has a metal base material 12 in which a reflective cup portion 14 for reflecting a light emitted from a light-emitting element 15 toward a predetermined direction is formed, and an enamel layer 13 that covers the surface of this metal base material 12, with the thickness of the enamel layer 13 being within a range of 30 μm to 100 μm.

4 Claims, 2 Drawing Sheets

SUBSTRATE FOR MOUNTING LIGHT-EMITTING ELEMENT AND LIGHT-EMITTING ELEMENT MODULE

This application is a continuation application based on a PCT Patent Application No. PCT/JP2006/311098, filed on Jun. 2, 2006, whose priority is claimed on Japanese Patent Application No. 2005-167493, filed on Jun. 7, 2005. The content of both the PCT Application and the Japanese Application are incorporated herein by reference.

TECHNICAL FIELD

The present invention relates to a substrate for mounting a light-emitting element used for mounting a light-emitting element such as a light-emitting diode (hereinafter sometimes referred to as an LED) and a light-emitting element module provided with the same.

BACKGROUND ART

In recent years, light-emitting elements such as light-emitting diodes (LEDs) have been applied to lighting units, backlights for liquid crystal image devices, and traffic signals, with further improvements in luminescence intensity being sought. It is possible to increase the luminescence intensity of light-emitting elements by increasing the amount of current to be impressed. However, simultaneous with this, since the light-emitting element is accompanied by heat generation, it is necessary to dissipate the heat more efficiently. When heat dissipation is insufficient, the temperature of the light-emitting element becomes high when on, leading to a drop in luminous efficiency, and so the target luminescence intensity is not obtained. Also, in the case of using a light-emitting element over an extended period, when the heat dissipation is insufficient, since the light-emitting element continues to generate high heat over a long time, the reliability of the light-emitting element falls, thereby raising the possibility of problems such as non-lighting occurring.

Also, in order to protect the light-emitting element from the external environment such as external forces and humidity, it is generally packaged. Moreover, in order to efficiently radiate forward light that is emitted from the light-emitting element, a lighting unit is known in which cup machined portions are formed at predetermined positions in one of two metal substrates that are combined, with the light-emitting elements being mounted in the cup machined portions (for example, refer to patent documents 1 and 2).

Patent Document 1: Japanese Unexamined Patent Application, First Publication No. 2001-332768
Patent Document 2: Japanese Unexamined Patent Application, First Publication No. 2001-332769

DISCLOSURE OF INVENTION

Problem to be Solved by the Invention

Since the lighting units disclosed in patent documents 1 and 2 require a step for preparing a metal substrate on which the cup machined portions are formed and another metal substrate and then assembling them, this leads to a rise in costs.

The present invention was achieved in view of the above circumstances, and has as its object to provide a substrate for mounting a light-emitting element that has excellent efficiency in extracting light from a light-emitting element and can be manufactured at a low cost, and a light-emitting element module that is provided with the same.

Means for Solving the Problem

In order to solve the above issues, the present invention provides a substrate for mounting a light-emitting element that has a metal base material in which a reflective cup portion for reflecting a light emitted from a light-emitting element toward a predetermined direction is formed, and an enamel layer that covers the surface of this metal base material, with the thickness of the enamel layer being set within a range of 30 μm to 100 μm.

Also, the present invention provides a light-emitting element module that is provided with the above-mentioned substrate for mounting a light-emitting element and a light-emitting element that is mounted in the reflective cup portion of this substrate for mounting a light-emitting element.

Effects of the Invention

According to this invention, since it is possible to constitute the substrate for mounting a light-emitting element that has the reflective cup portion with a single metal base material, the structure of the substrate is simplified, and so the assembly cost can be saved. Also, since the enamel layer of a predetermined thickness is provided on the surface of the metal base material, in addition to imparting excellent heat dissipation and electrical insulation properties, it is possible to secure the flatness of the reflective cup portion. Thereby, it is possible to increase the luminescence intensity of the light-emitting element and possible to improve the production yield of light-emitting element modules by securing the mounting area of the light-emitting element.

BRIEF DESCRIPTION OF THE REFERENCE SYMBOLS

10 light-emitting element module; 11 substrate for mounting a light-emitting element (enameled substrate); 12 metal base material; 13 enamel layer; 14 reflective cup portion; 15 light-emitting element

BEST MODE FOR CARRYING OUT THE INVENTION

Hereinbelow, based on the best mode, the present invention shall be described with reference to the drawings.

Figure 1:
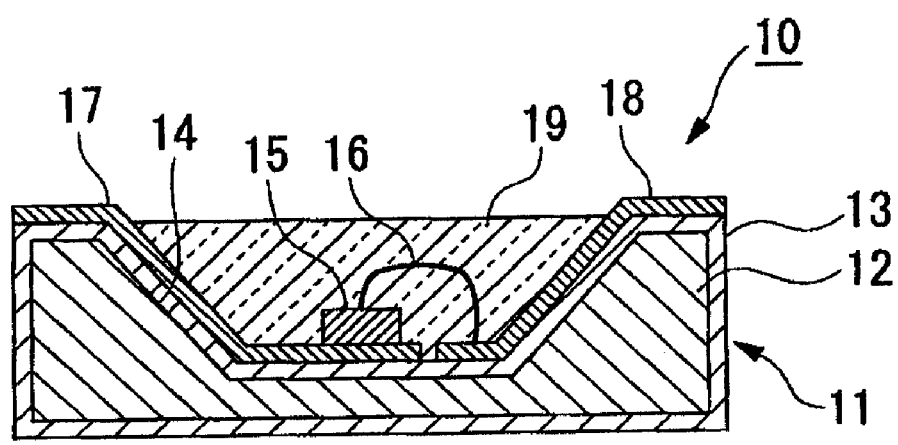
FIG. 1 is a cross-sectional view that shows an example of the light-emitting element module of the present invention.
Figure 2:
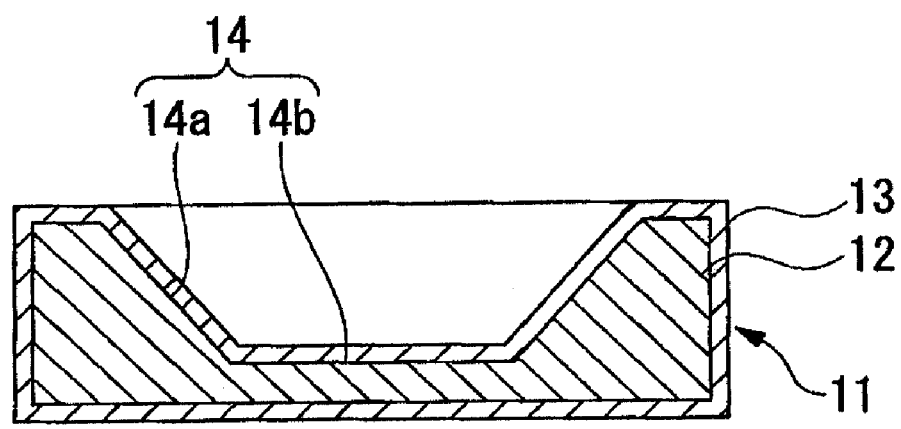
FIG. 2 is a cross-sectional view that shows an example of the substrate for mounting a light-emitting element of the present invention.

FIG. 1 is a cross-sectional view that shows the light-emitting element module of the present embodiment, and FIG. 2 is a cross-sectional view that shows the substrate for mounting a light-emitting element of the present embodiment.

A substrate for mounting a light-emitting element 11 that is shown in FIG. 1 and FIG. 2 consists of an enameled substrate that has a metal base material 12 in which a reflective cup portion 14 that reflects light that is emitted from a light-emitting element 15 in a predetermined direction is formed, and an enamel layer 13 that is constituted by a glass component that covers the surface of this metal base material 12 (the substrate for mounting a light-emitting element 11 hereinafter shall be referred to at times as the enameled substrate 11). Since it is possible to form the metal base material 12 in any shape by machining, it is therefore possible to form the enamel layer 13 on the metal base material 12 that has an arbitrary surface shape, and so it is possible to ensure the electrical insulating property of the enameled substrate 11. Moreover, in the present invention, the thickness of the enamel layer 13 is within a range of 30 μm to 100 μm.

A light-emitting element module 10 shown in FIG. 1 is constituted by being provided with a light-emitting element 15 that is mounted on a bottom surface 14b of the reflective cup portion 14, a first electrode 17 to which the light-emitting element 15 is connected, a second electrode 18 that is provided on the upper surface of the substrate for mounting a light-emitting element 11 in the state of being divided from the first electrode 17, a wire bond 16 that electrically connects the light-emitting element 15 to the second electrode 18, and a transparent sealing resin 19 that seals the light-emitting element 15 by being filled and hardened in the reflective cup portion 14.

The metal base material 12 of the enameled substrate 11 can be manufactured using various metal materials. Those materials are not restricted, but a metal material that can be easily machined at a low cost is preferred, for example, steel such as extremely low carbon steel, low carbon steel and stainless steel. The shape of the metal base material 12 is not particularly restricted, and can be made a rectangular plate shape, for example, but is not particularly restricted to this, and may be suitably selected in accordance with the use of the light-emitting element module 10. The number of pieces constituting the reflective cup portion 14 is not particularly restricted, and may be one as illustrated, and may also be provided in a plurality. The placement of the reflective cup portion 14 on the upper surface of the enameled substrate 11 can also be suitably designed, being not particularly restricted.

As methods of forming the reflective cup portion 14 on the metal base material 12, it is possible to employ metal cutting using a cutting tool such as a drill, drawing with a metal press, or polishing using a hard metal grindstone. Among these, drawing with a metal press is preferable from the standpoint of productivity and machining cost. The bottom surface 14b of the reflective cup portion 14 on which the light-emitting element 15 is mounted is made into a flat surface having a surface area that sufficiently ensures the mounting area for the light-emitting element 15. A side surface 14a that encloses the perimeter of the bottom surface 14b of the reflective cup portion 14 preferably is a sloping surface with a tapered shape in which the opening surface area expands toward the surface of the metal base material 12. The boundary portion between the side surface 14a and the bottom surface 14b may be formed in the shape illustrated, and it is possible to provide a groove in the boundary portion.

As the material of the enamel layer 13 that is provided on the upper surface of the metal base material 12, it is possible to choose and use one from among conventional materials having glass as a main material to be used for forming an enamel layer on a metal surface.

Among these, an alkali-free glass material is preferred, with the heat conductivity of this glass material being approximately 1 W/mK. In the present invention, the thickness of the enamel layer 13 is within a range of 30 μm or more and 100 μm or less. When the thickness of the enamel layer 13 is less than 30 μm, although the heat dissipation property is satisfactory, since it is too thin, the core metal ends up being exposed in places, and so the electrical insulating property cannot be maintained. When the thickness of the enamel layer 13 is too thick, the electrical insulating property can be sufficiently maintained, but the heat dissipation property falls.

Figure 3:
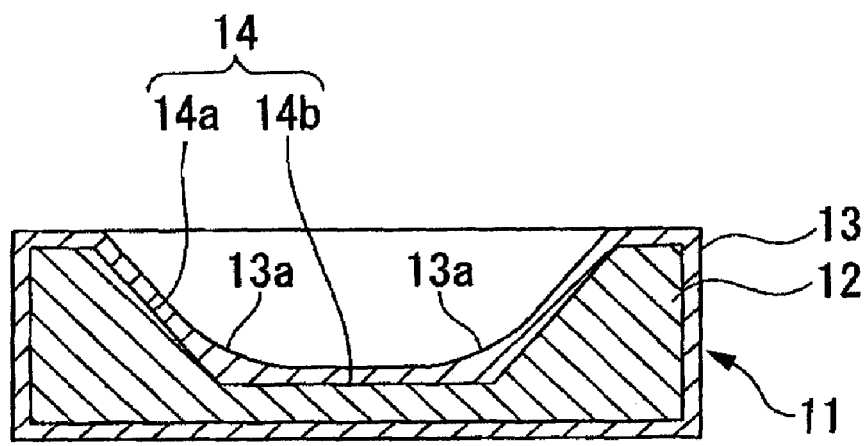
FIG. 3 is a cross-sectional view that shows an example of the state of mound of the enamel layer occurring in a corner of the bottom surface of the reflective cup portion of the substrate for mounting a light-emitting element.

Moreover, in the case of the thickness of the enamel layer 13 exceeding 100 μm, as shown in FIG. 3, a mound portion 13a may arise as a result of the glass material that constitutes the enamel layer 13 accumulating in the edge portion of the bottom surface 14b of the reflective cup portion 14. When the electrodes 17, 18 are formed on the mound portion 13a, due to the effect of the surface undulation of the enamel layer 13 that is a foundation of the electrodes 17, 18, it is difficult to sufficiently ensure a flat location suited to mounting of the light-emitting element 15. By making the thickness of the enamel layer 13 within a range of 30 μm to 100 μm, it is possible to secure the flatness of the enamel layer 13 that is formed on the bottom surface 14b of the reflective cup portion 14 and therefore the mounting area for the light-emitting element 15. From these standpoints, a more preferable thickness of the enamel layer 13 is within a range of 30 μm or more and less than 50 μm.

The light-emitting element 15 is not particularly restricted, for example, a semiconductor light-emitting element such as a light-emitting diode (LED) or a laser diode (LD) is suitable. Also, the luminescent color of the light-emitting device 15 is not particularly restricted, for example, blue, green, red, or any other luminescent color is acceptable. Specific examples include blue light-emitting elements or green light-emitting elements such as nitride compound semiconductors, and red light-emitting elements or infrared light-emitting elements represented by gallium phosphide (GaP). Also, it is possible to constitute a white LED by mounting a blue light-emitting element such as a nitride compound semiconductor in the reflective cup portion 14 and including a blue-exciting yellow light-emitting phosphor in the sealing resin 19 (for example, a cerium-activated yttrium-aluminum-garnet phosphor).

In the case of providing a plurality of reflective cup portions 14 in the enameled substrate 11 and arranging light-emitting elements 15 to be mounted, the type and luminescent color of the light-emitting elements 15 are not particularly restricted. For example, when used in a traffic signal or the like, the luminescent color of the light-emitting devices 15 may be aligned to a single color, and in the case of a display unit, LEDs and the like of differing luminescent colors may be regularly or irregularly arranged. Moreover, it is possible to constitute a display unit by arraying pixels that are constituted by combinations of blue LEDs, green LEDs, and red LEDs on the enameled substrate 11 having a large surface area. Also, by using a white LED as the light-emitting element 15 and mounting multiple white LEDs in a matrix on the enameled substrate 11, it is possible to constitute a flat-type lighting unit having a large area.

Metal wire and the like that is made of gold (Au) and the like may be used as the wire bond 16. The connection of this wire bond 16 can be performed by bonding using a wire bonding equipment conventionally used for connection of the light-emitting elements 15 and the like.

The electrodes 17, 18 that are provided on the upper surface of the enameled substrate 11 can, for example, be formed by stretching thick film silver paste from the outside to the interior of the reflective cup portion 14. Also, it is possible to form the electrodes 17, 18 by mounting a copper foil on the reflective cup portion 14 by press molding.

It is possible to provide the sealing resin 19 with high light transmittance in order to seal the light-emitting element 15 and the connection portions of the light-emitting element 15 and the electrodes 17, 18 as necessary in the reflective cup portion 14. Examples of the sealing resin 19 include a thermosetting epoxy resin, an ultraviolet setting epoxy resin, and a silicone resin, and the like.

The structure of the light-emitting element module 10 shown in FIG. 1 is one in which the electrodes 17, 18 are exposed on the upper surface of the enamel layer 11. However, an electrical insulator such as resin may be disposed on the exposed portions in order to ensure the electrical insulating property.

In addition, as necessary it is possible to combine lens body that consists of a transparent medium such as resin or glass above the sealing resin 19 or above the light-emitting element module 10.

According to the substrate for mounting a light-emitting element 11 of the present embodiment, since it is possible to constitute the substrate for mounting a light-emitting element 11 by using a single metal base material 12 that has the reflective cup portion 14, the structure of the substrate is simplified, and the assembly cost can be contained. Also, since the enamel layer 13 is provided on the surface of the metal base material 12 at a predetermined thickness, in addition to imparting excellent heat dissipation and electrical insulation properties, it is possible to ensure the flatness of the bottom surface 14b of the reflective cup portion 14. Thereby, it is possible to increase the luminescence intensity of the light-emitting element 15 with the light-emitting element module 10 of the present embodiment. By ensuring the mounting area of the light-emitting element 15, it is possible to improve the production yield of the light-emitting element module 10.

Embodiments

Manufacture of Enameled Substrate

A low-carbon steel plate with a thickness of 1.5 mm is cut into dimensions of 10 mm long by 10 mm wide, and the reflective cup portion 14 is formed therein by a drill or metal press. The reflective cup portion 14 has a depth of 0.6 mm, with the diameter of the bottom surface 14b being 2.1 mm, and the sloping angle of the side surface 14a being 45 degrees. The enameled substrate 11 is produced by providing the enamel layer 13 by coating the surface of the metal plate with glass after being machined. The forming of the enamel layer 13 is performed by the following method.

Glass powder is dispersed in a suitable dispersing medium such as 2-propanol, and the metal base material 12 that has the reflective cup portion 14 is immersed in the dispersing medium. Moreover, the electrode that is of opposite polarity is also placed in the same dispersing medium. By passing current between the metal base material 12 and the electrodes, the glass powder is electrodeposited onto the surface of the metal base material 12. Then, the enamel layer 13 is firmly coated onto the surface of the metal base material 12 by baking the glass powder in the atmosphere. In order to more firmly coat, the surface of the metal base material 12 (low-carbon steel) may be subjected to oxidation treatment.

A plurality of enameled substrates 11 were manufactured as shown in Table 1, varying the target thickness of the enamel layer 13 within a range of 10 μm to 300 μm. For each enameled substrate 11, the thickness of the enamel layer 13 (coating thickness), heat dissipation property (heat resistance value), electrical insulating property, and the flatness of the bottom surface of the reflective cup were evaluated. The results are presented in Table 1.

TABLE 1

|  | Coating Thickness (μm) (measured value) | Heat Resistance Value (° C./W) | Electrical Insulating Property (Breakdown Voltage Test Result) | Flatness (within 10 μm) |
|---|---|---|---|---|
| Example 1 | 30 | 17.2 | OK | OK |
| Example 2 | 51 | 17.2 | OK | OK |
| Example 3 | 100 | 17.6 | OK | OK |
| Comparative Example 1 | 148 | 18.1 | OK | NG (15 μm height difference) |
| Comparative Example 2 | 19 | 17.2 | NG | OK |

(Evaluation of Heat Dissipation Property)

The evaluation of the heat dissipation property was performed as follows. Electrodes for supplying electrical power to the light-emitting element 15 are produced, silver paste is applied so as to produce the electrode structures shown in FIG. 1 and then baked to produce the enameled substrate 11. Next, a blue light-emitting element (XB900 by Cree Inc.) is connected to the electrode 17 on the substrate by silver paste using a die bond (not illustrated), and then joined to the electrode 18 that opposes the light-emitting element 15 using the wire bond 16 that consists of a gold wire. Then, thermosetting epoxy resin is filled in the reflective cup portion 14 until the upper portion sufficiently swells up due to surface tension and then hardened to form the sealing resin 19. Thereby, the light-emitting element module 10 is manufactured.

Initially, as a preliminary test, a graph that shows the relationship between voltage value and temperature for each light-emitting element module 10 was produced by the following method.

First, the light-emitting element module 10 is left to become a steady temperature, and then the voltage value is measured for approximately 1 sec. with a low current (10 mA in this instance). The reason for using a low current value here is that passing a high current will cause the temperature of the element itself to be added to the ambient temperature due to the heat generation by the element itself.

With this method, the voltage value is measured with respect to a plurality of ambient temperatures, and then graphed.

Next, as the main experiment, the thermal resistance value is measured by the following method for each light-emitting element module 10.

The ambient temperature is set to room temperature (25°), and at that time current of 350 mA is passed for 1 hour. Then, the current value is rapidly dropped to 10 mA, and the voltage value is measured. Referring to the above-mentioned graph produced in advance that shows the relationship between voltage values and temperature, the temperature corresponding to this voltage value is set as the temperature (A) of the light-emitting element. Moreover, the temperature (B) of the underside of the substrate is measured simultaneously by a thermocouple. The thermal resistance value is then found by dividing the temperature difference of the light-emitting element and the substrate underside (A−B) by the impressed power (current×voltage).

(Evaluation of Electrical Insulating Property)

Silver paste is applied to the entire surface of the side of the enamel layer 11 on which the reflective cup portion 14 is provided and then baked to produce a substrate for evaluation of the electrical insulating property. Electrodes are connected to both sides of this evaluation substrate, and then a voltage breakdown test was performed by passing 1000 V of direct current. It was evaluated as "OK" in the case of the maintaining the electrical insulating property under this voltage breakdown test, and evaluated as "NG" in the case of not being able to maintain the electrical insulating property.

(Flatness of Reflective Cup Bottom Surface)

The area required for mounting the light-emitting element 15 is a 1,000 μm square located at the center of the bottom surface 14b of the reflective cup portion 14. The maximum minus minimum values of the height of the enamel layer 13 within that area are recorded. It is evaluated as "OK" when the absolute value of the difference between the maximum value of the height and the minimum value of the height (height difference) is within 10 μm, and evaluated as "NG" when the height difference exceeds 10 μm.

(Evaluation Result)

The above evaluation confirms that the range of 30 μm to 100 μm is suitable for the thickness of the enamel layer 13 of the substrate for mounting a light-emitting element 11 that has the reflective cup 14.

Note that following the voltage breakdown test for evaluating the electrical insulating property, the evaluation substrate which is evaluated as "NG" is further investigated and then confirmation is made that the internal steel plate is partially exposed. From this, a sample that fails to pass the voltage breakdown test can be described as one in which the glass did not adhere partially, since the film thickness of the target enamel layer is too thin.

INDUSTRIAL APPLICABILITY

The present invention can be used for various products in which light-emitting elements such as LEDs are mounted, such as lighting units, display units, and traffic signals.

The invention claimed is:

1. A device comprising a light-emitting element mounted on the substrate, wherein said substrate has a metal base material in which a reflective cup portion for reflecting a light emitted from the light-emitting element element toward a predetermined direction is formed, and an enamel layer that covers an entire surface of this metal base material, and wherein the thickness of the enamel layer is set within a range of 30 μm to 100 μm.

2. A light-emitting element module comprising a substrate, which has a metal base material in which a reflective cup portion for reflecting a light emitted from a light-emitting element toward a predetermined direction is formed, and an enamel layer that covers an entire surface of this metal base material, wherein said enamel layer having a thickness within a range of 30 μm to 100 μm; and, the light-emitting element, which is mounted in the reflective cup portion of the substrate.

3. The substrate according to claim 1, wherein the enamel layer is made of materials including glass as a main material.

4. The substrate according to claim 3, wherein the glass is alkali-free glass material.

* * * * *